US010530122B2

(12) United States Patent
Bellingrath

(10) Patent No.: US 10,530,122 B2
(45) Date of Patent: Jan. 7, 2020

(54) CIRCUIT ARRANGEMENT AND METHOD FOR CONTROLLING AND MEASURING A CURRENT IN A CHARGE ELEMENT

(71) Applicant: Silicon Line GmbH, Munich (DE)

(72) Inventor: Thomas Bellingrath, Gruenheide (DE)

(73) Assignee: Silicon Line GmbH, Munich (DE)

( * ) Notice: Subject to any disclaimer, the term of this patent is extended or adjusted under 35 U.S.C. 154(b) by 0 days.

(21) Appl. No.: 16/027,129

(22) Filed: Jul. 3, 2018

(65) Prior Publication Data

US 2018/0331499 A1 Nov. 15, 2018

Related U.S. Application Data

(63) Continuation of application No. PCT/DE2017/100003, filed on Jan. 4, 2017.

(30) Foreign Application Priority Data

Jan. 4, 2016 (EP) .................................... 16150111

(51) Int. Cl.
*H01S 3/00* (2006.01)
*H01S 5/026* (2006.01)
(Continued)

(52) U.S. Cl.
CPC ........ *H01S 5/0261* (2013.01); *G01R 19/0092* (2013.01); *G05F 1/10* (2013.01);
(Continued)

(58) Field of Classification Search
CPC .... H01S 5/06808; H01S 5/0427; H01S 5/042; H01S 5/068; H01S 5/0261; H01S 5/026
See application file for complete search history.

(56) References Cited

U.S. PATENT DOCUMENTS 5,425,040 A * 6/1995 Krawczak ............... H01S 5/042
323/282
5,546,218 A * 8/1996 Komatsubara ........ G02F 1/0121
359/237
(Continued)

FOREIGN PATENT DOCUMENTS

DE 102 40 914 A1 3/2004
DE 102 58 766 A1 7/2004
(Continued)

OTHER PUBLICATIONS

International Search Report issued in PCT/DE2017/100003; dated May 29, 2017.

*Primary Examiner* — Kinam Park
(74) *Attorney, Agent, or Firm* — Studebaker & Brackett PC

(57) ABSTRACT

In order to provide a circuit arrangement and a method for controlling and measuring a current in at least one charge element, in particular in at least one laser diode, which can be used at a low operating voltage with laser current control and/or at a low drop in voltage, also for so-called "low power" applications, it is proposed to couple three MOSFETs in a split manner for a charge path and for two measurement paths and to maintain the three MOSFETs by means of an auxiliary controller at the same working point such that they deliver the modulation current and comparison currents fixed with respect to the modulation current. The comparison currents are used to determine the average modulation current and feed a control device which delivers these currents—and thus also the average modulation current—to a desired value in which an operational or control voltage is varied on a circuit block by the control device. The circuit block delivers output signals depending on the operational or control voltage in the amplitude, said output signals
(Continued)

controlling two or more circuit elements in the charge path and the measurement paths.

17 Claims, 7 Drawing Sheets

(51) Int. Cl.
    *H01S 5/068*     (2006.01)
    *H01S 5/042*     (2006.01)
    *G05F 1/10*     (2006.01)
    *G01R 19/00*     (2006.01)
    *H05B 33/08*     (2006.01)

(52) U.S. Cl.
    CPC ............ *H01S 5/026* (2013.01); *H01S 5/0427* (2013.01); *H01S 5/068* (2013.01); *H01S 5/06808* (2013.01); *H01S 5/042* (2013.01); *H05B 33/0884* (2013.01)

(56) References Cited

U.S. PATENT DOCUMENTS

| | | | | |
|---|---|---|---|---|
| 6,037,832 | A * | 3/2000 | Kaminishi | H01S 5/042 323/312 |
| 6,618,406 | B1 * | 9/2003 | Kaminishi | H01S 5/042 372/38.02 |
| 2002/0158654 | A1 * | 10/2002 | Graf | G01R 19/0092 324/762.07 |
| 2004/0155662 | A1 * | 8/2004 | Graf | G01R 19/0092 324/522 |
| 2006/0181289 | A1 * | 8/2006 | Deboy | G01R 19/0092 324/713 |
| 2010/0007328 | A1 * | 1/2010 | Sander | G01R 19/0092 324/76.11 |

FOREIGN PATENT DOCUMENTS

| | | |
|---|---|---|
| DE | 103 44 486 A1 | 4/2005 |
| DE | 10 2005 046980 A1 | 4/2007 |
| DE | 10 2008 032556 B3 | 9/2009 |

* cited by examiner

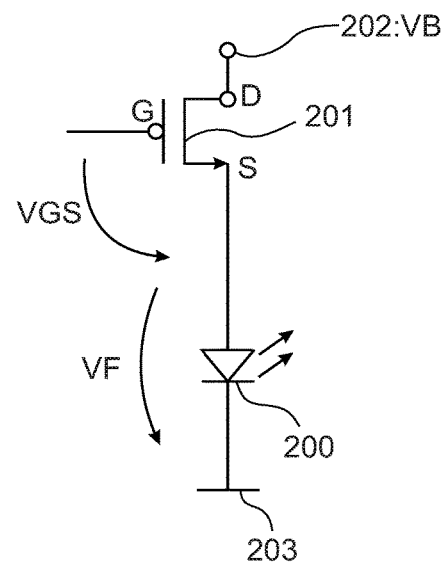
Fig. 1 [prior art]
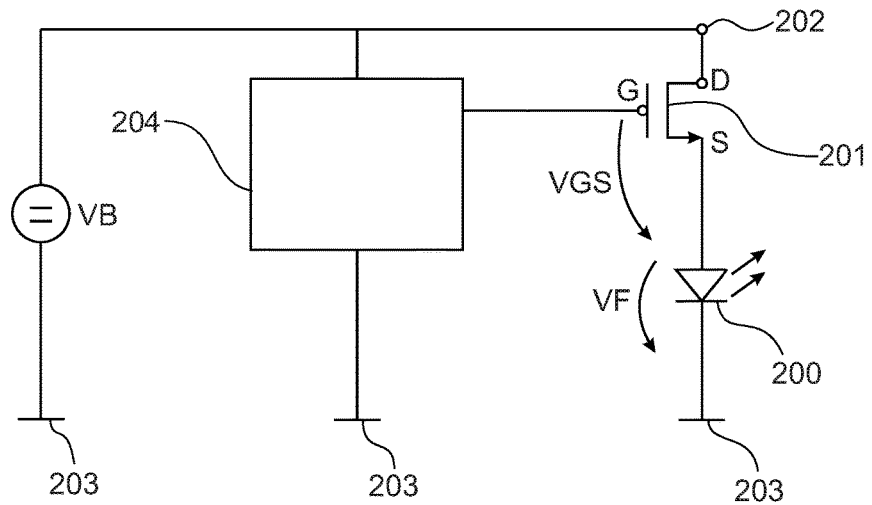
Fig. 2 [prior art]

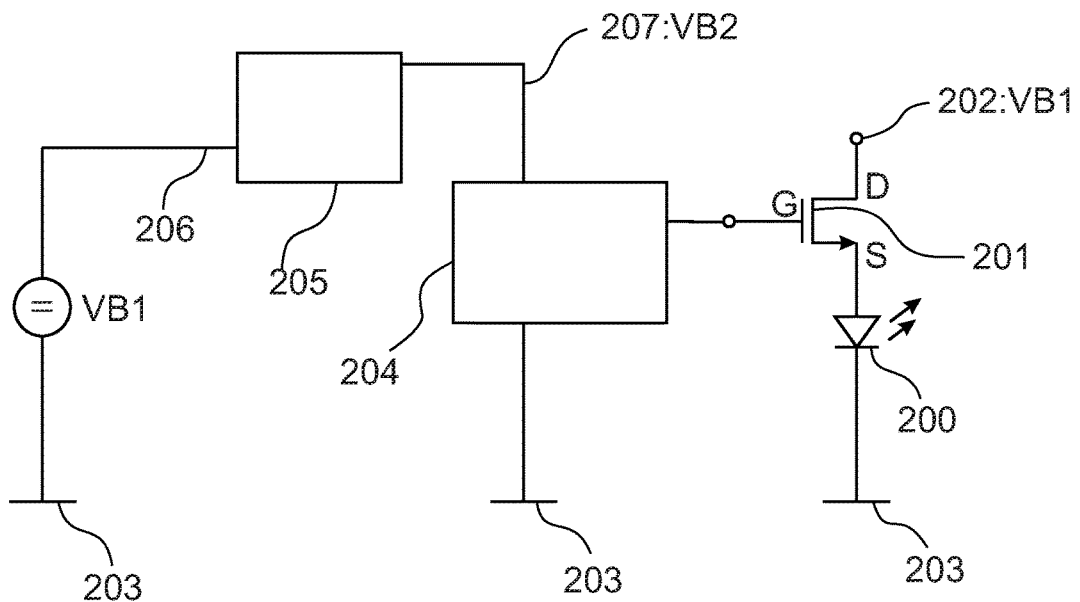
Fig. 3 [prior art]
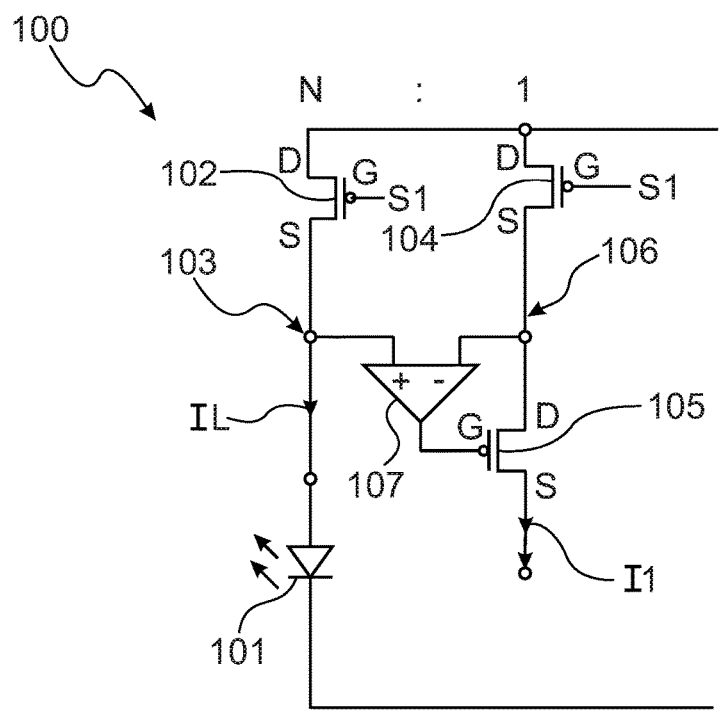
Fig. 4

CIRCUIT ARRANGEMENT AND METHOD FOR CONTROLLING AND MEASURING A CURRENT IN A CHARGE ELEMENT

CROSS-REFERENCE TO RELATED APPLICATIONS

This application is a continuation of international (WO) patent application no. PCT/DE2017/100003, filed 4 Jan. 2017, which claims the priority of European (EP) patent application no. 16 150 111.9, filed 4 Jan. 2016, the contents of each being hereby incorporated herein by reference.

FIELD OF THE DISCLOSURE

The present disclosure relates to a circuit arrangement and a method for controlling and measuring an electrical current, in particular load current, in at least one charge element, in particular in at least one laser diode.

BACKGROUND OF THE DISCLOSURE

Active optical cables (AOCs) consist of transmitting and receiving elements which are built into the connectors and optically transmit a data signal over the fiber optic cable on the route between them. In this context, low-power laser drivers are needed for low operating voltages.

A laser driver for a data signal must, on the one hand, modulate the laser current used and, on the other hand, control the average modulation current generated thereby. The difficulty consists in achieving, on the one hand, highest switching speeds and, on the other hand, setting a specified working point of the laser.

The laser current and switching status of a laser are often set with separate circuit elements, so that two circuit elements (transistors) with a corresponding drop in voltage are required in series for this. However, the at least required drop in voltage together with the laser limits the applicability within predefined operating voltage limits.

Driving laser diodes in CMOS technologies with data signals for direct modulation is often performed in source follower configuration to take advantage of the so-called Class AB characteristic, that is, the dynamic current variation, of this configuration in the low-impedance driving of the capacitance of the laser diode.

FIG. 1 shows a schematic diagram of a simple driver circuit for a laser diode 200 used here as a charge element with a field effect transistor 201 in source follower circuit. In this case, D is a drain connection of the field effect transistor 201, G is a gate connection of the field effect transistor 201 and S is a source connection of the field effect transistor 201.

A main current path, that is, the drain-source path, of the field effect transistor 201 is arranged in series connection with the laser diode 200 between an operating voltage connection 202 at which an operating voltage VB is delivered and ground 203.

A gate-source voltage VGS is applied between the gate connection G and the source connection S, which voltage is referred to as a working point DC voltage Vt, also referred to as a threshold voltage, and a modulation AC voltage ΔV, also referred to as voltage for the modulation of the field effect transistor, is composed as its sum:

$$VGS = Vt + \Delta V$$

A forward voltage VF is applied across the laser diode 200 as a load.

The total required drop in voltage Vsum across the laser diode 200 and the driving transistor, that is, the field-effect transistor 201, in particular a MOSFET, must therefore contain at least:
 the forward voltage VF of the laser diode 200;
 the threshold voltage Vt of the driving MOSFET 201;
 the voltage ΔV for the modulation of the MOSFET 201:

$$V\text{sum} \geq VGS + VF = Vt + \Delta V + VF$$

In order to be able to use this configuration in low-power applications, that is, applications for low operating voltages, either an operating voltage VB available for the driver must be at least correspondingly high, as shown schematically in the circuit arrangement according to FIG. 2, or within the circuit a higher second operating voltage VB2 must be generated as an external first operating voltage VB1, as shown schematically in FIG. 3.

In the circuit arrangement according to FIG. 2, both the series connection of the laser diode 200 and the main current path, that is, the drain-source path of the field effect transistor 201 and a laser driver, thus a driving circuit 204 for the field effect transistor 201, are arranged between the operating voltage connection 202 and ground 203. The operating voltage VB required for driving must be selected to be correspondingly high, which leads to a high power consumption of the circuit arrangement.

In the circuit arrangement according to FIG. 3, which shows an example for the internal generation of a higher operating voltage, the driving circuit 204 for the field effect transistor 201 is connected via a DC-DC converter 205 to the first operating voltage VB1, which incidentally is also supplied to the operating voltage connection 202 and is dimensioned such so that the series connection of field effect transistor 201 and laser diode 200 can be operated.

The comparatively higher second operating voltage VB2 for supplying the driving circuit 204 is taken from an output 207 of the DC-DC converter 205, to which the first operating voltage VB1 is supplied at an input 206. A high circuit complexity is required for this configuration; in addition, when using the DC-DC converter 205, a precise analysis of occurring time constants is necessary to avoid interference.

The laser current, that is, the current through the laser diode 200, is often either only controlled or measured at a series resistance, which causes an additional drop in voltage.

Laser drivers in a so-called common-source configuration are considered to be poorly suited for high data rates or fast signals due to the Miller capacitance of the transistor.

OBJECTS AND SUMMARY OF THE DISCLOSURE

Starting from the above-explained disadvantages and shortcomings as well as taking the outlined prior art into account, the object of the present disclosure is to provide a circuit arrangement and a method for controlling and measuring a current in at least one charge element, in particular in at least one laser diode, which can be used at low operating voltage with laser current closed-loop control and/or with low drop in voltage, that is, suitable for so-called "low-power" applications.

This object is achieved by a circuit arrangement according to the present disclosure with the herein described features and by a method according to the present disclosure with the herein described features. Advantageous embodiments and expedient further developments of the present disclosure are characterized in the respective dependent claims.

This object is achieved by a circuit arrangement for controlling and measuring an electrical load current in at least one charge element, having
- a load circuit element arranged in series with the charge element, which load circuit element is set up to control the load current,
- at least one first measurement path having a first measurement path circuit element coupled with the load circuit element in a predefinable coupling ratio N:a; N:1 and controlled by a first control signal in common with the load circuit element and a first voltage control element arranged in series with the first measurement path circuit element,
- an auxiliary controller for controlling the first voltage control element depending on a difference in voltages across the load circuit element and across the first measurement path circuit element such that the voltage across the measurement path circuit element is controlled depending on the voltage across the load circuit element, so that a first measurement current proportional to the load current is generated in the first measurement path circuit element and in the first voltage control element.

This object is further achieved by an embodiment of the circuit arrangement according to the present disclosure, further comprising a second measurement path having a second measurement path circuit element coupled with the load circuit element in a predefinable coupling ratio N:b; N:1 and a voltage control element arranged in series with the second measurement path circuit element, wherein the second measurement path circuit element is set up for controlling by a second control signal complementary to a first control signal and the second voltage control element is set up for control in common with the first voltage control element by the auxiliary controller such that a second measurement current is generated in the second measurement path circuit element and in the second voltage control element, the variation of which is inversely proportional to that of the load current.

This object is further achieved by an embodiment of the circuit arrangement according to the present disclosure, wherein the load circuit element, the first measurement path circuit element and/or the second measurement path circuit element are connected to output connections on the one hand each to a capacitive component, that is, set up on the other hand for supplying a signal complementary to the relevant circuit element supplied control signal.

This object is further achieved by an embodiment of the circuit arrangement according to the present disclosure, further comprising a circuit block for forming the first control signal and optionally additionally the second control signal for controlling the load circuit element, the first measurement path circuit element and/or the second measurement path circuit element, wherein the circuit block for supplying an amplitude adjustment voltage and for forming the first control signal and optionally additionally the second control signal is set up with an amplitude depending on the amplitude adjustment voltage and/or an operating voltage that can be supplied to the circuit block.

This object is further achieved by an embodiment of the circuit arrangement according to the present disclosure,
- wherein the circuit block is configured with CMOS devices,
- wherein the amplitude adjustment voltage is at least almost equal to an operating voltage provided for operating the CMOS devices, and
- wherein the circuit block is set up to receive the amplitude adjustment voltage supplied as the operating voltage and to form the first control signal and optionally additionally the second control signal with an output amplitude proportional to the operating voltage.

This object is further achieved by an embodiment of the circuit arrangement according to the present disclosure, wherein the circuit block is configured with a device for supplying an asymmetric modulation signal and for forming therefrom the first control signal and optionally additionally the second control signal as at least almost symmetrical or push-pull signals.

This object is further achieved by an embodiment of the circuit arrangement according to the present disclosure, further comprising a control device which is set up for
- supplying the first measurement current and optionally the second measurement current,
- evaluating the first measurement current and optionally the second measurement current, and
- on this basis, forming and adjusting the amplitude adjustment voltage and/or operating voltage which can be supplied to the circuit block such that a target value of the first measurement current or optionally of a linear combination of the first measurement current and second measurement current and thus a target value of the modulation current, that is, the load current modulated by the first control signal, is achieved.

This object is further achieved by an embodiment of the circuit arrangement according to the present disclosure, wherein the control device for forming a summation signal is set up from the sum of the first and second measurement currents, wherein the summation signal has a lower and/or slower temporal variation with respect to the first and the second measurement current.

This object is further achieved by an embodiment of the circuit arrangement according to the present disclosure, wherein for the load circuit element and/or for the first measurement path circuit element and/or for the second measurement path circuit element, a respective constant current source is arranged in parallel connection coupled with the relevant one of the circuit elements in a predefinable coupling ratio, wherein in particular the constant current sources are dimensioned to one another in a same or similar coupling ratio N:a:b; N:1:1 as the load circuit element, the first measurement path circuit element and/or the second measurement path circuit element are to one another.

This object is further achieved by an embodiment of the circuit arrangement according to the present disclosure, wherein the charge element is configured as at least one laser diode.

This object is further achieved by a method for controlling and measuring an electrical load current in at least one charge element, in particular in at least one laser diode,
- wherein the load current is controlled by means of a load circuit element arranged in series with the charge element,
- wherein a first measurement path circuit element is coupled with the load circuit element in a predefinable coupling ratio N:a; N:1 and is controlled by a first control signal in common with the load circuit element, and
- wherein a first voltage control element arranged in series with the first measurement path circuit element in at least one first measurement path by means of an auxiliary controller depending on a difference of the voltages across the load circuit element and across the first measurement path circuit element is controlled such that the voltage across the measurement path circuit element is controlled depending on the voltage across the load circuit element, so that a first measurement current proportional to the load current is generated in the first measurement path circuit element and in the first voltage control element.

This object is further achieved by an embodiment of the method according to the present disclosure, wherein a second measurement path circuit element coupled with the load circuit element in a predefinable coupling ratio N:b; N:1 is controlled by a second control signal complementary to the first control signal and in that a second voltage control element arranged in series with the second measurement path circuit element in a second measurement path is controlled in common by means of the auxiliary controller with the first voltage control element such that a second measurement current is generated in the second measurement path circuit element and in the second voltage control element, the variation of which is inversely proportional to that of the load current.

This object is further achieved by an embodiment of the method according to the present disclosure, wherein the first control signal and optionally additionally the second control signal for controlling the load circuit element, the first measurement path circuit element and/or the second measurement path circuit element is formed by a circuit block, wherein an amplitude adjusting voltage supplied by the circuit block and the first control signal and optionally additionally the second control signal is formed with an amplitude depending on the amplitude adjustment voltage and/or an operating voltage that can be supplied to the circuit block.

This object is further achieved by an embodiment of the method according to the present disclosure, wherein the circuit block is set up to receive the amplitude adjustment voltage supplied as the operating voltage and to form the first control signal and optionally additionally the second control signal with an output amplitude proportional to the operating voltage.

This object is further achieved by a use of at least one circuit arrangement according to the present disclosure and/or of a method according to the present disclosure for driving at least one charge element, in particular at least one laser diode, in optical data transmission, in particular in at least one active optical cable (AOC).

In other words, the present disclosure provides a circuit arrangement and a method for controlling and measuring a current in at least one charge element, in particular a laser current, having a load circuit element which is in series with the charge element, for example, a laser diode, and a coupled path through the measurement path circuit element, via which the voltage is controlled depending on the voltage across the load circuit element by means of the auxiliary controller and the first voltage control element, so that a measurement current proportional to the laser current is generated.

The circuit arrangement according to the disclosure forms a driver circuit, in particular a power-efficient laser driver for low operating voltages with a laser current closed-loop control and/or with a low drop in voltage, and makes it possible to control the working point and switching status with a single element in series. This is advantageous for applications with low operating voltage, so-called "low-power" applications.

To clarify the term, it should be added that a matching of semiconductor circuit elements consists in laying out several components, for example, by means of suitable semiconductor topography, that is, layout measures, in such a way that they have identical or very similar properties.

It is also possible to achieve such matching properties except for a scaling factor; in particular, the coupling here relates to the ratio of the currents which flow through the relevant semiconductor circuit elements, which ratio may be designed to be equal to one or different from one.

The latter is described below as "coupled in a split manner". For further explanation, reference is made to the monograph "Halbleiter-Schaltungstechnik" ("Semiconductor Circuit Technology") by U. Tietze and Ch. Schenk, published by Springer-Verlag, 8th Edition, 1986, in particular page 64 and page 69.

According to the disclosure, a variable modulating component of the laser current is generated by a single circuit element in series with the laser with defined average and determined with a coupled path or paths for closed-loop control of the driving of the circuit element to a level that sets the desired average value of the modulation current.

According to a preferred development, the circuit arrangement according to the disclosure and/or the method according to the disclosure are/is characterized by a second measurement path having a second measurement path circuit element coupled with the load circuit element in a predeterminable coupling ratio and a second voltage control element arranged in series with the second measurement path circuit element, wherein the second measurement path circuit element is set up for controlling by a second control signal complementary to the first control signal, and the second voltage control element is set up for controlling by the auxiliary controller common with the first voltage control element, so that a second measurement current is generated in the second measurement path circuit element and in the second voltage control element, the variation of which is inversely proportional to that of the load current.

The thus further developed circuit arrangement contains a further coupled path, which is controlled complementarily and generates a current with complementary alternating or signal component.

In a further preferred embodiment, the load circuit element, the first measurement path circuit element and/or the second measurement path circuit element are connected at output connections on the one hand to a respective capacitive component which is set up on the other hand for supplying a signal complementary to the relevant circuit element supplied control signal.

In this embodiment, the input capacitances of the switches, that is, the load circuit element, of the first and/or the second measurement path circuit element are precompensated by capacitors for a complementary signal.

In an advantageous development, the circuit arrangement according to the disclosure and/or the method according to the disclosure are/is characterized by a circuit block for forming the first and optionally additionally the second control signal for controlling the load circuit element, the first and/or the second measurement path circuit element, wherein the circuit block for supplying an amplitude adjustment voltage and for forming the first and optionally additionally the second control signal is set up with an amplitude depending on the amplitude adjustment voltage and/or an operating voltage that can be supplied to the circuit block.

In this development, the circuit arrangement according to the disclosure is combined with a circuit block that controls the circuit arrangement according to the disclosure and provides an output signal and preferably also a signal of variable amplitude complementary to this output signal, wherein the variable amplitude depends on a control voltage, referred to here as an amplitude adjustment voltage, or an operating voltage of circuit arrangement.

According to a preferred embodiment of the present disclosure, this is characterized in that the circuit block is configured with CMOS devices, the amplitude adjustment voltage is at least almost equal to an operating voltage provided for operating the CMOS devices, and the circuit block is set up to receive the amplitude adjustment voltage supplied as the operating voltage and to form the first and optionally additionally the second control signal with an output amplitude proportional to the operating voltage.

In this embodiment of the present disclosure, therefore, the control voltage, that is, the amplitude adjustment voltage, corresponds to the operating voltage of a CMOS block, which thus provides an output amplitude of the first and optionally additionally of the second control signal complementary to the first control signal that is proportional to the operating voltage.

In a further preferred embodiment, the circuit block is configured with a device for supplying an asymmetrical modulation signal and for forming therefrom the first control signal and optionally additionally the second control signal as at least almost symmetrical or push-pull signals.

In particular, this device is configured with two parallel branches to which the symmetric modulation signal can be supplied in parallel and which each comprise a multiplication stage which are configured to multiply the asymmetrical modulation signal with control voltages which are poled in the opposite direction, that is, in particular, the amplitude adjustment voltage in positive or negative polarity.

The multiplication stages are preferably coupled on the output side, each with an inverter output stage, of two transistors, preferably field-effect transistors, arranged in series connection with their main current paths between the operating voltage and ground.

An advantageous development is characterized by a control device which is set up for supplying the first and optionally the second measurement current, evaluating the first and optionally the second measurement current and on this basis, forming and setting the amplitude adjustment voltage and/or operating voltage which can be supplied to the circuit block such that a target value of the first measurement current or optionally a linear combination of the first and second measurement currents and thus a target value of the modulation current, that is, the load current modulated by the first control signal, is reached.

This control device, also in short referred to as a controller, evaluates one or more of the measurement currents proportional to the load current, that is, the first and optionally additionally the second measurement current, from a circuit arrangement of the type described above and adjusts based on the control voltage, that is, amplitude adjustment voltage, or operating voltage to a circuit block of the type described above, so that a target value, that is, desired value, of the first measurement current or a target value of a linear combination, for example, the sum, of the measurement currents and thus the corresponding modulation current, is reached.

According to a preferred embodiment, the control device is set up to form a summation signal from the sum of the first and second measurement currents, wherein the summation signal has a smaller and/or slower temporal variation with respect to the first and second measurement currents.

According to this embodiment of the control device, the varying measurement currents running in opposite directions are added so that the resulting summation signal varies essentially more slowly in time and can be used more easily for closed-loop control. In this addition, the measurement currents can enter with different weighting factors, so that in addition to a simple addition, a weighted linear combination of the measurement currents is also possible.

Particularly preferred is a combination of one of the above-described configurations of the circuit arrangement and/or the method for controlling and measuring an electrical load current in at least one charge element with a circuit block, also referred to as a drive block, of the type described above and a controller of the type described above.

According to another embodiment, for the load circuit element and/or for the first measurement path circuit element and/or for the second measurement path circuit element, a respective constant current source is arranged in parallel connection coupled with the relevant one of the circuit elements in a predefinable coupling ratio, wherein in particular the constant current sources are dimensioned to one another in a same or similar coupling ratio as the load circuit element, the first measurement path circuit element and/or the second measurement path circuit element are to one another.

In this embodiment, thus additionally, in a similar ratio as the load circuit element and the first measurement path circuit element and optionally additionally the second measurement path, coupled constant current sources are attached to the load circuit element and to the first measurement path circuit element and optionally additionally to the second measurement path circuit element, that is, attached to the charge path and the coupled measurement paths, to each specify a minimum current in the charge element and in the measurement path or the measurement paths.

In an advantageous development, the charge element is configured with a laser diode. This represents a preferred application of the disclosure. The circuit arrangement according to the disclosure makes it possible to control and/or measure the load current, that is, here, the current in the laser diode, also referred to as laser current, at low operating voltages and thus a low-power operation.

The present disclosure and its preferred embodiments are characterized by the following specific features and advantages:

The charge element, in particular a laser diode, is controlled with the drain connection of a field effect transistor at a low drain-source voltage.

In a circuit block, preferably a circuit block configured with CMOS devices, also referred to as CMOS circuit block for short, a first and optionally additionally a second control signal is formed for controlling the load circuit element, the first and optionally additionally the second measurement path circuit element; in particular, the first and second control signals are complementary to one another. The operating voltage of the circuit block is adjustable for the purpose of closed-loop control the amplitude of the control signals.

At the source connection of the load circuit element or the measurement path circuit element or the measurement path circuit elements, the inverse or complementary control signal is capacitively coupled into the control signal supplied at the gate connection of the relevant circuit element. A compensation of the node capacitance at the drain connection of the respective circuit element, that is, field effect transistor including a compensation of the Miller effect of driving the gate connection by the relevant control signal, a compensation of the laser diode capacitance, etc. is achieved through this, in order nevertheless to reach high modulation rates.

The circuit elements, that is, field effect transistors, are set to a defined on-resistance, also referred to as "R_on", by means of voltage levels at the gate connection that are exactly coupled to the desired current modulation depth.

The charge path, also referred to as a laser current path, with the load circuit element and the charge element, that is, the laser diode, are set up one or two coupled paths for measuring the current in the charge element, in particular the laser current. In these coupled paths, the measurement path circuit elements formed with control transistors are maintained at the same working point as the load circuit element, in particular, as a driver FET for the laser current.

The voltage levels required to set the defined on-resistances of the field effect transistors are ensured by a current measurement on the at least one path coupled with the charge path with the load circuit element and the charge element, that is, the laser diode, and by closed-loop control of the operating voltage for the CMOS circuit block.

The aforesaid current measurement is preferably used for closed-loop control of output levels of a pre-stage circuit, also referred to as a "pre-driver circuit", for example by closed-loop control of the operating voltage of the aforementioned circuit block, preferably of the circuit block configured with CMOS devices, in short, CMOS circuit block.

The coupling of the charge path or load circuit element with the measurement paths or measurement path circuit elements can be done in different selectable coupling ratios. This is especially true when two measurement paths are configured and the individual measured currents measured therein are combined into a resulting measurement current. In the simplest case, a coupling between the load current and the measurement currents can be selected in a ratio of N:1:1, and the measurement currents can be combined by simple addition, preferably in a current node. Instead, the coupling between the load current and the measurement currents can be made in a randomly deviating ratio of, for example, N:a:b with a≠b. Then any linear combinations of the individual measurement currents, in which they can be weighted differently, are possible. It is also possible to couple the measurement currents with each other in a ratio of 1:1 with a subsequent weighting of the individual measurement currents by means of different weighting factors in a superimposition stage.

The circuit arrangement according to the disclosure gets by with a low drop in voltage across the charge element, in particular the laser diode, and the associated load circuit element, preferably driver transistor, in particular field effect transistor; a generation of higher operating voltages is not necessary.

The current measurement on the coupled measurement path requires no drop in voltage in the charge path.

By providing two coupled measurement paths for current measurement which are controlled with mutually complementary control signals, an influence of the current time profile of the modulation signal on the working point control of the charge element, in particular the laser diode, is prevented and thus a bandwidth independent of the modulation signal in a controlled system for closed-loop control of the current in the charge element, also referred to as load current or preferably laser current here, is achieved. The modulation dependence of the measurement currents is reduced or compensated during their addition or combination.

Finally, the present disclosure relates to the use of at least one circuit arrangement according to the above-described type and/or a method according to the above-described type for driving at least one charge element, in particular at least one laser diode, in optical data transmission, in particular in at least one active optical cable (AOC).

Thus, in one implementation example of the present disclosure, three MOSFETs for a charge path and two measurement paths may be coupled in a split manner and maintained at the same working point via an auxiliary controller so that they provide the modulation current and fixed comparison currents in constant ratio for it.

The comparison currents can be used to determine the average modulation current and to feed a control device, which brings these—and thus the average modulation current—to a desired value in which an operational or control voltage is varied at a circuit block by the control device. In doing so, the circuit block supplies output signals depending on the operational or control voltage in the amplitude that control two or more circuit elements in the charge path and the measurement paths.

BRIEF EXPLANATION OF THE DRAWINGS

As already discussed hereinbefore, there are various possibilities for embodying and further developing the teaching of the present disclosure in an advantageous manner. To this end, on the one hand reference is made to the explanations above as well as to the dependent claims, on the other hand further embodiments, features and advantages of the present disclosure are explained in greater detail hereinafter, inter alia based upon the exemplary embodiments illustrated by FIG. 4 to FIG. 13.

It is shown in:

FIG. 1 a schematic diagram of a simple driver circuit for a laser diode used here as a charge element with a field effect transistor in source follower circuit;

FIG. 2 a schematic diagram of a circuit arrangement in which both the series connection of the laser diode and the main current path of the field effect transistor and a driving circuit for the field effect transistor are arranged between a common operating voltage and ground;

FIG. 3 a modification of the schematic diagram of the circuit arrangement of FIG. 1, in which the series circuit of the laser diode and the main current path of the field effect transistor is connected to a first operating voltage and in which the driving circuit for the field effect transistor for the internal generation of a higher operating voltage is connected via a DC-DC converter to the first operating voltage;

FIG. 4 an exemplary embodiment of a circuit arrangement according to the disclosure operating according to the method of the disclosure with a charge path, here a laser current path, with the load circuit element and the charge element, that is, the laser diode, and a first measurement path coupled thereto;

The like, similar or corresponding embodiments, elements or features are provided with identical reference numerals in FIG. 1 to FIG. 13; a repeated description of these embodiments, elements or features is therefore dispensed with.

DETAILED DESCRIPTION OF THE DISCLOSURE

Figure 5:
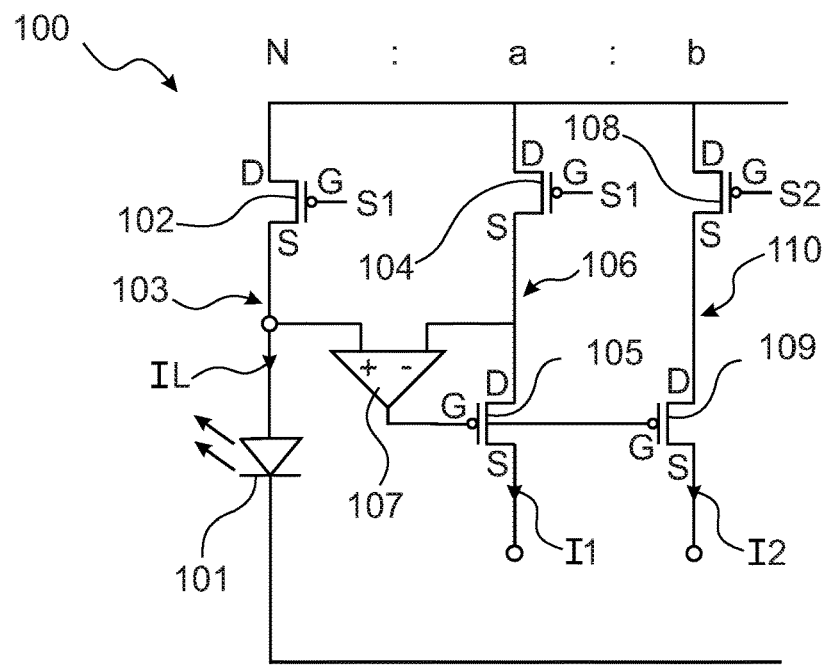
FIG. 5 a modification of the exemplary embodiment of a circuit arrangement according to the disclosure of FIG. 4 operating according to the method of the disclosure with a charge path and a first measurement path coupled thereto and a second measurement path coupled thereto.

In order to avoid unnecessary repetitions, the explanations below concerning the embodiments, features and advantages of the present disclosure relate—unless stated otherwise—to all exemplary embodiments of the present disclosure illustrated with reference to FIG. 4 to FIG. 13.

In FIG. 4, reference numeral 100 denotes a first exemplary embodiment of a circuit arrangement according to the disclosure:

The circuit arrangement 100 comprises a charge path 103, here a laser current path, which is configured with a charge element 101, here a laser diode, and a load circuit element 102, here a field-effect transistor, in particular a MOSFET, wherein the laser diode 101 and a drain-source path forming a main current path are arranged between a drain connection D and a source connection S of the MOSFET 102 in series connection.

The circuit arrangement 100 further comprises a first measurement path 106 coupled with the charge path 103, which with a first measurement path circuit element 104, here likewise a field effect transistor, in particular a MOSFET, and a first voltage control element 105 arranged in series, that is, series connection, with the first measurement path circuit element 104 is also configured with a field effect transistor, in particular with a MOSFET.

In particular, in doing so, the load circuit element 102 and the first measurement path circuit element 104 are coupled, here preferably coupled in a split manner in the ratio N:1. This means that a load current IL in the load circuit element 102 and therefore also in the charge element 101 that is N times a first measurement current I1 in the first measurement path circuit element 104 and thus also in the first voltage control element 105, provided that the load circuit element 102 and the first measurement path circuit element 104 are controlled concurrently:

$$IL = N*I1$$

This concurrent driving is given here by a first control signal S1, which is supplied both to a gate connection G of the load circuit element 102 and to a gate connection G of the first measurement path circuit element 104.

In addition, an auxiliary controller 107 is provided for setting this concurrent driving of the load circuit element 102 and the first measurement path circuit element 104, which controller is preferably designed here as an operational amplifier.

Each one of the input connections of the auxiliary controller 107 is connected to the source connection S of the load circuit element 102 or the first measurement path circuit element 104. An output connection of the auxiliary controller 107 is connected to a gate connection G of the first voltage control element 105.

In this way, the auxiliary controller 107 for controlling the first voltage control element 105 depending on a difference in voltages across the load circuit element 102 and across the first measurement path circuit element 104 is set up such that the voltage across the measurement path circuit element 104 is controlled depending on the voltage across the load circuit element 102.

FIG. 5 shows a modification of the exemplary embodiment of a circuit arrangement 100 according to the disclosure of FIG. 4. This modification comprises, in addition to the charge path 103 and the coupled first measurement path 106, a coupled second measurement path 110 at that, wherein the coupling ratio of the charge path 103, the first measurement path 106 and the second measurement path 110 is now generalized N:a:b, that is, the load current IL, the first measurement current I1 and a second measurement current I2 in the second measurement path 110 behave according to the relation IL:I1:I2=N:a:b.

The second measurement path 110 is designed with a second measurement path circuit element 108, here likewise a field effect transistor, in particular a MOSFET, and a second voltage control element 109 arranged in series, that is, series connection, with the second measurement path circuit element 108, which second voltage control element likewise is configured with a field effect transistor, in particular a MOSFET. In particular, in doing so, the load circuit element 102, the first measurement path circuit element 104 and the second measurement path circuit element 108 are coupled, preferably here coupled in a split manner in the ratio N:a:b.

The first and the second voltage control elements 105, 109 are controlled in common via their gate connections G from the output connection of the auxiliary controller 107 to which they are connected. As a result, the voltage at the load circuit element 102 is transferred to the voltages at the two measurement path circuit elements 104, 108.

In contrast to the first measurement path circuit element 104, a second control signal S2 is supplied to the second measurement path circuit element 108 at its gate connection G. The second measurement path 110 is complementarily modulated to the first measurement path 106 and the charge path 103 by the second control signal S2.

As will be explained in more detail below, the control signals are obtained from a modulation signal which comprises a sequence of binary data to be transmitted via the laser diode. In addition to the laser current IL, this modulation signal, that is, the data sequence, enters into the measurement currents I1, I2 and exerts a disturbing influence on the current measurement and thus the working point control of the laser diode 101.

In two measurement currents I1, I2 obtained from complementary controlled measurement paths 106, the modulation signal components from the control signals S1, S2 occur in opposite directions and can be at least largely canceled by linear combination, preferably addition, of the measurement currents I1, I2, so that the working point control of the laser diode 101 from the modulation signal and thus also from the modulation current, that is, from the AC component in the load current IL caused by the modulation of the laser current IL, is at least largely independent.

Figure 6:
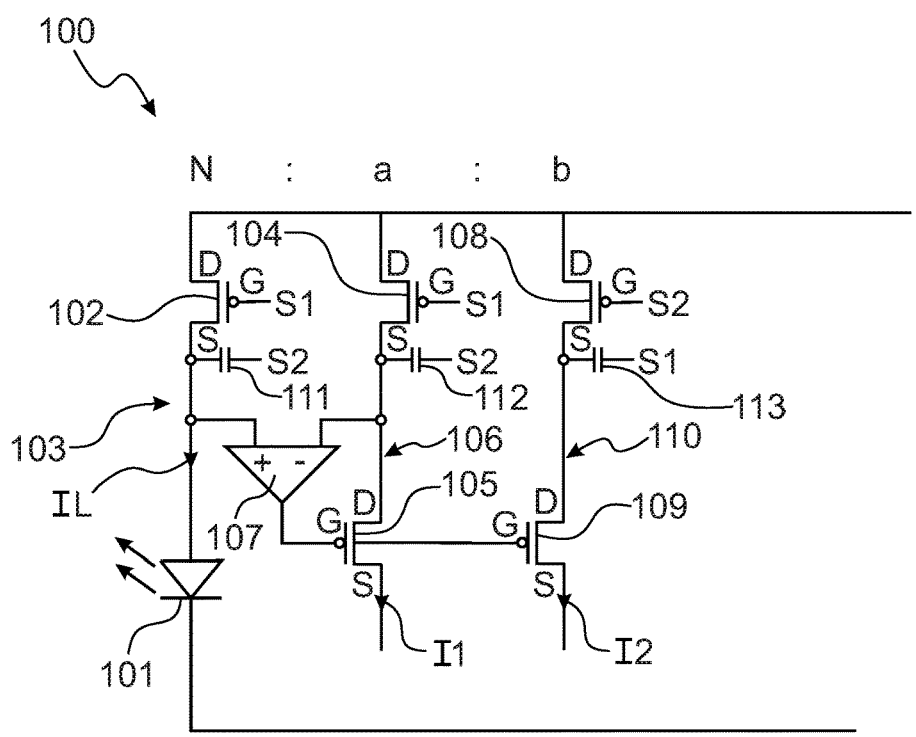
FIG. 6 a modification of the exemplary embodiment of a circuit arrangement according to the disclosure of FIG. 5 operating according to the method of the disclosure, in which the load circuit element and the measurement path circuit elements are connected at output connections on the one hand each with a capacitive component, on the other hand is set up for supplying a signal complementary to the relevant circuit element supplied control signal.

FIG. 6 shows a modification of the circuit arrangement 100 of FIG. 5. In this case, in addition to FIG. 5, the load circuit element 102 and the measurement path circuit elements 104, 108 are connected to output connections, here the source connections S of the field effect transistors, on the one hand each with one capacitive component 111, 112 or 113.

On the other hand, the relevant capacitive component 111, 112 or 113 is supplied with that of the two control signals S1, S2, which is complementary to the control signal S1 or S2, which is supplied to the relevant circuit element.

In detail, this means that
the first control signal S1 is fed to the load circuit element 102 at its gate connection G, and the second control signal S2 complementary to the first control signal S1 is fed to its source connection S via a first 111 of the capacitive components 111, 112 or 113,
the first control signal S1 is fed to the first measurement circuit element 104 at its gate connection G, and the second control signal S2 complementary to the first control signal S1 is fed to its source connection S via a second 112 of the capacitive components 111, 112 or 113,
the second control signal S2 is fed to the second measurement circuit element 108 at its gate connection G and first control signal S1 complementary to the second control signal S2 is fed at its source connection S via a third 113 of the capacitive components 111, 112 or 113.

Through the connection of the capacitive components 111, 112 or 113, the input capacitances of the load circuit element 102, the first and/or the second measurement path circuit element 104 or 108 are precompensated for the respective complementary signal.

Figure 7:
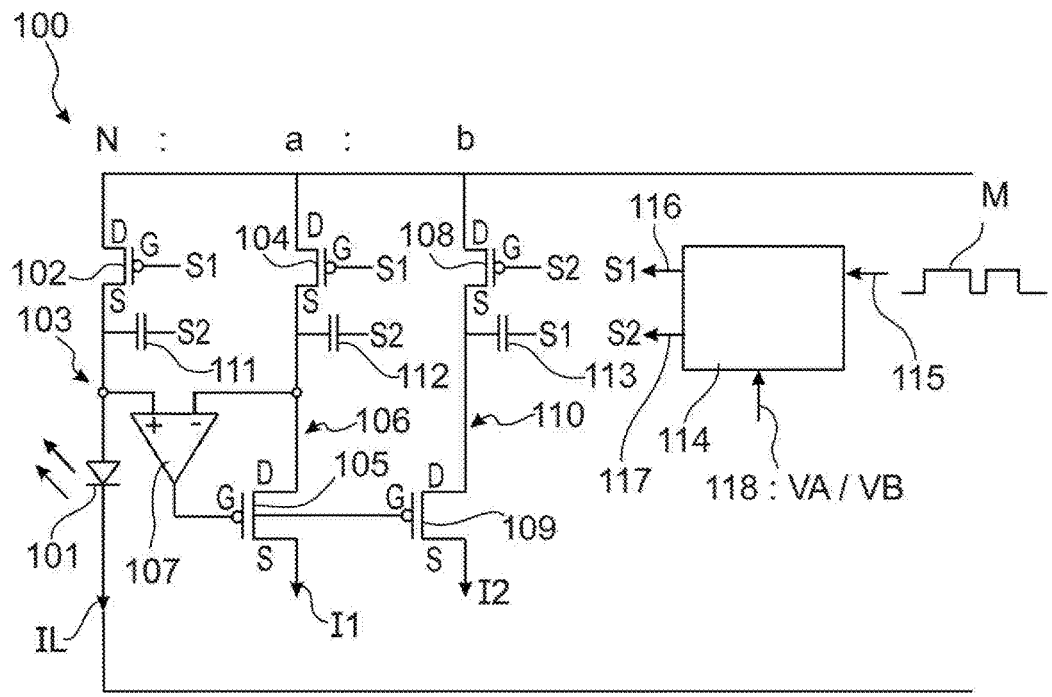
FIG. 7 a modification of the exemplary embodiment of a circuit arrangement according to the disclosure of FIG. 6 operating according to the method of the disclosure, with a circuit block for forming control signals for controlling the load circuit element and the measurement path circuit elements.

FIG. 7 shows a modification of the circuit arrangement 100 of FIG. 6. Therein, the otherwise identical arrangement of FIG. 6 is extended by a circuit block 114 for forming the control signals S1, S2 for controlling the load circuit element 102 and the measurement path circuit elements 104, 108.

The circuit block 114 has an input connection 115, to which the modulation signal M, that is, that signal, in particular data signal, from which the control signals S1, S2 for the load circuit element 102 and the measurement path circuit elements 104, 108 are discharged, is fed. The control signals S1, S2 formed in the circuit block 114 are output as output signals to output connections 116 or 117 of the circuit block 114.

The circuit block 114 is set up to supply an amplitude adjustment voltage VA and to form the first and second control signals S1, S2 with an amplitude depending on the amplitude adjustment voltage VA and/or an operating voltage VB that can be supplied to the circuit block 114. The amplitude adjustment voltage VA and/or the operating voltage VB are supplied to the circuit block 114 via a control input 118.

Figure 8:
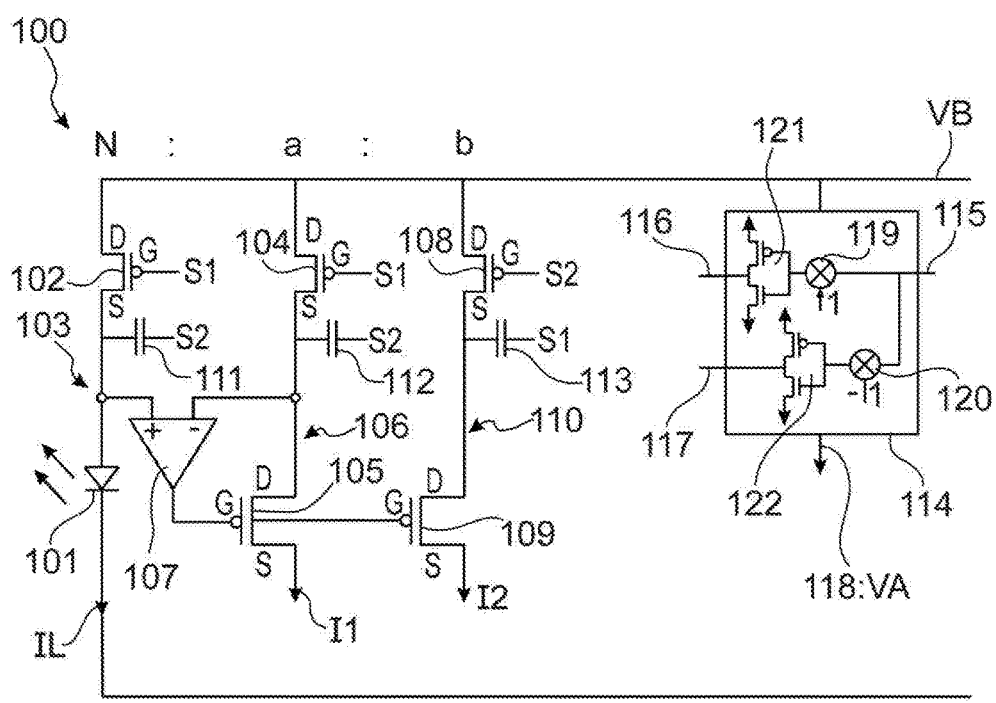
FIG. 8 a modification of the exemplary embodiment of a circuit arrangement according to the disclosure of FIG. 7 operating according to the method of the disclosure, in which further details of the circuit block are shown roughly schematically.

FIG. 8 roughly schematically shows some details of the internal structure of the circuit block 114 with circuit configuration otherwise unchanged with respect to FIG. 7. This comprises a first and a second multiplication stage 119 or 120, the respective first input of which is connected to the input connection 115 for supplying the modulation signal M.

A respectively second input of the multiplication stage 119 or 120 is supplied with a logic level "+1" or "−1", so that mutually complementary versions of the modulation signal M are delivered to outputs of the multiplication stages 119 and 120 and one input per push-pull final stage 121 or 122 are supplied from two each with their main current paths, that is, drain-source paths, field effect transistors arranged in series connection.

The first and second control signal S1, S2 are then delivered at the connection points of the field effect transistors arranged in series connection, which are connected to the output connections 116 or 117 of the circuit block 114.

Because of the implementation of the single-pole modulation signal M in differential, symmetrically modulated control signals S1, S2 in the multiplication stages 119 or 120, the circuit part containing the multiplication stages 119, 120 is also referred to as a "single-ended-to-differential" circuit.

In the embodiment of FIG. 8, the circuit block 114 is supplied with the operating voltage VB on the one hand and with the amplitude input voltage VA via the control input 118 on the other hand. Preferably, the control input 118 may form a ground connection of the circuit block 114 and the amplitude adjustment voltage VA may be its ground potential. By adjusting the amplitude adjustment voltage VA at a constant operating voltage VB, an amplitude adjustment of the control signals S1, S2 can then be made.

Figure 9:
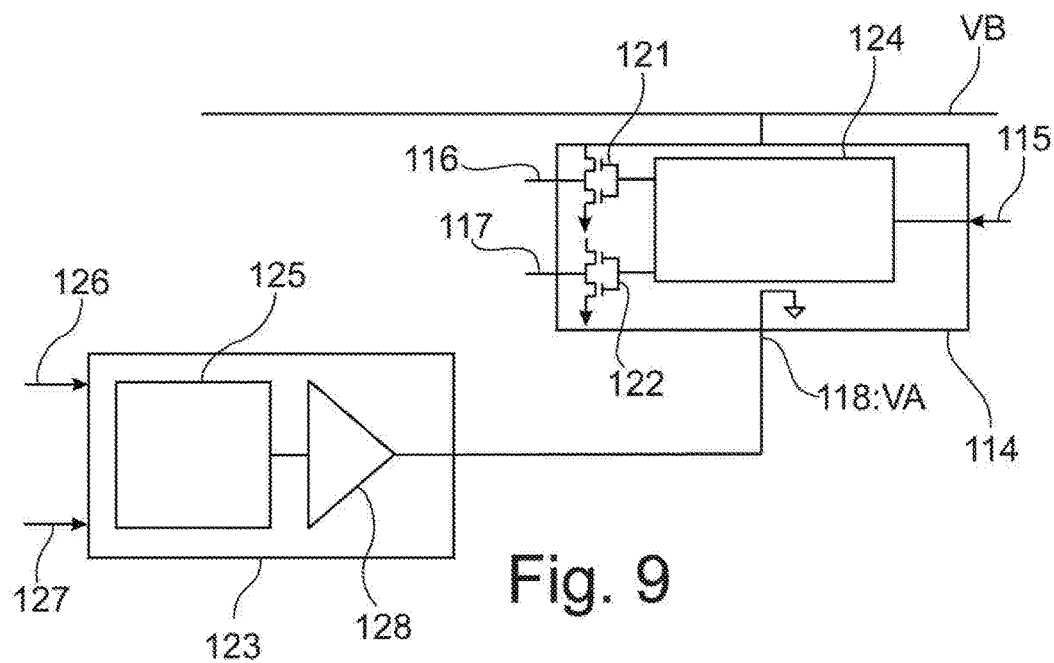
FIG. 9 a roughly schematic representation of a control device which cooperates with the circuit block of FIG. 7 or of FIG. 8 for supplying an amplitude adjustment voltage and/or operating voltage.

This is also indicated in FIG. 9, in which a rough schematic representation of a control device 123 is depicted, which cooperates with the circuit block 114 of FIG. 7 or FIG. 8 for supplying an amplitude adjustment voltage VA at the control input 118 on the one hand and an operating voltage VB on the other hand.

In this case, the "single-ended-to-differential" circuit 124 is shown simplified. The control device 123 comprises a comparison stage 125 with two inputs 126 or 127. A measurement current is fed to a first 126 of these inputs 126, 127, a reference current Iref to the second 127 of the inputs 126, 127.

The measurement current and the reference current Iref are compared in the comparison stage 125. Based on this comparison, the amplitude adjusting voltage VA is formed and adjusted and supplied to the circuit block 114 via a control amplifier 128. The control amplifier 128 can preferably be designed with a filter characteristic, in particular as a low-pass filter.

The measurement current to be supplied to the first input 126 of the comparison stage 125 can be used optionally, preferably when the circuit arrangement 100 is configured with only a first measurement path 106, the first measurement current I1 or a superimposition, preferably a linear combination, of the first measurement current I1 and of the second measurement current I2.

Figure 10:
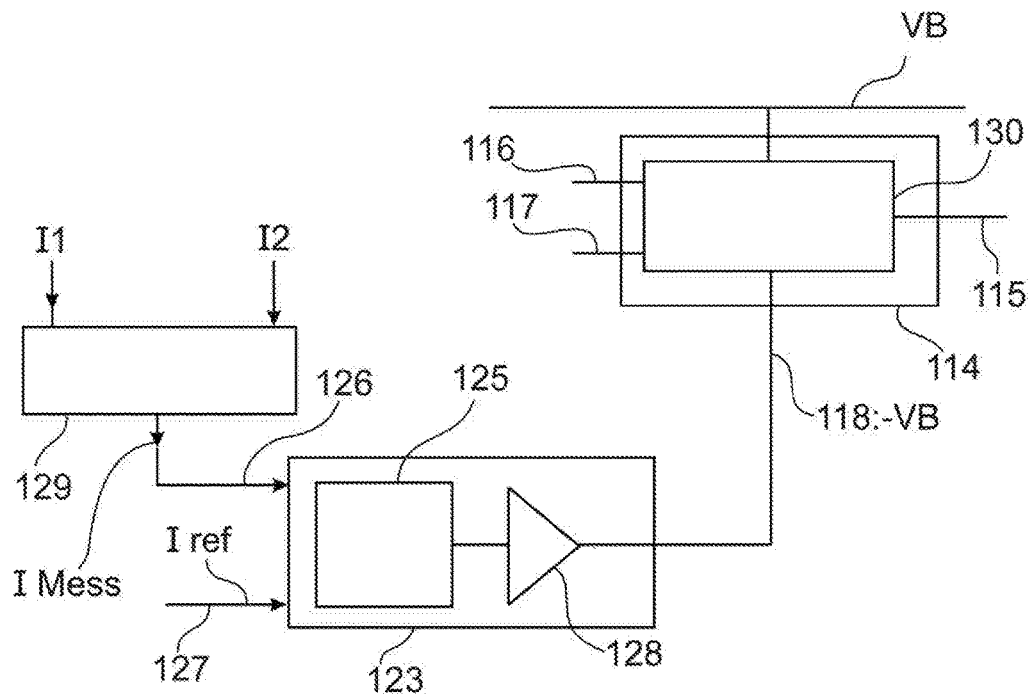
FIG. 10 a modification of the arrangement of FIG. 9 according to the disclosure operating according to the method of the disclosure with a roughly schematic representation of the formation of a resulting measurement current from a linear combination of the individual measurement currents in the measurement paths.

This second case is depicted in FIG. 10, which shows a modification of the arrangement of FIG. 9 with a roughly schematic representation of the formation of a resulting measurement current IMess from the first and the second measurement current I1 and I2 in a superposition stage 129.

In the superposition stage 129, the resulting measurement current IMess is formed according to the formula $$IMess = ga*I1 + gb*I27$$

wherein ga and gb represent weighting factors with which the measurement currents I1, I2 are weighted in the linear combination. The weighting factors ga, gb may be determined depending on the factors a, b of the split-manner coupling of the load circuit element 102 with the first and second measurement path circuit elements 104, 108.

In FIG. 10, the circuit block 114 is depicted simplified in which the "single-ended-to-differential" circuit 124 and the push-pull final stages 121, 122 are summarized in a circuit symbol 130. With regard to the above consideration, concerning the amplitude adjustment voltage VA, the negative operating voltage –VB is entered at the control input 118 as an amplitude control voltage VA.

Figure 11:
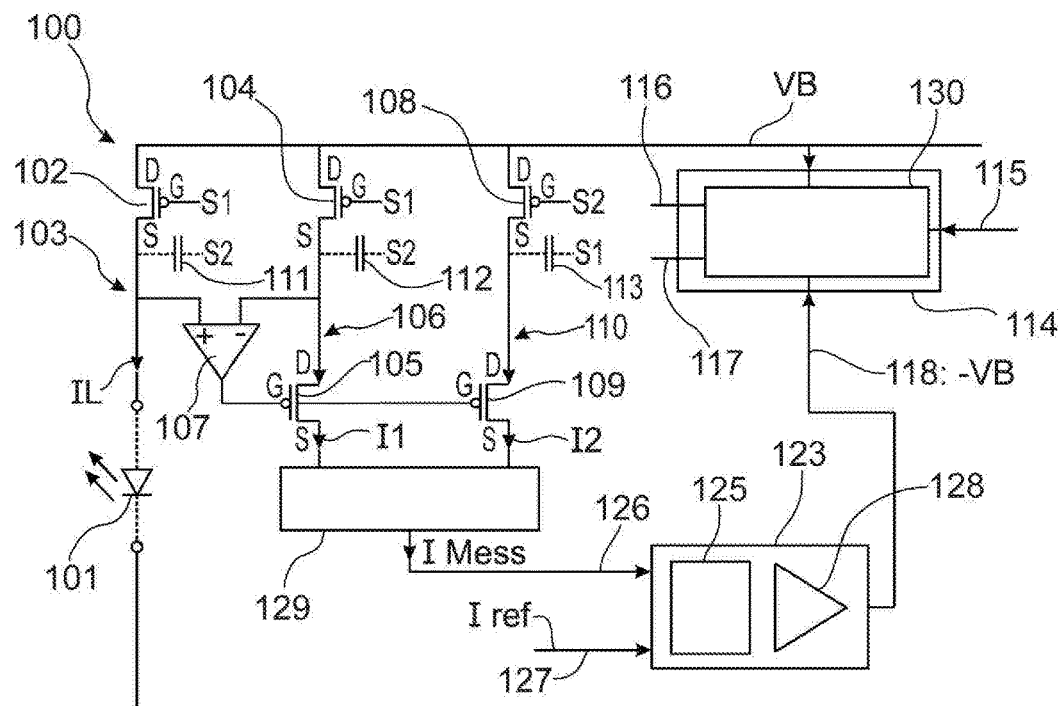
FIG. 11 a roughly schematic representation of a complete circuit arrangement according to the exemplary embodiments of FIG. 7 or of FIG. 8 operating according to the method of the disclosure with a control device according to the exemplary embodiments of FIG. 9 or of FIG. 10.

FIG. 11 shows, in a roughly schematic representation, an overview of the circuit parts represented in the preceding FIG. 6 to FIG. 10, that is, in particular a complete circuit arrangement 100 according to the exemplary embodiments of FIG. 7 or FIG. 8 with a control device 123 according to the exemplary embodiments of FIG. 9 or FIG. 10. In this case, the negative operating voltage –VB is again shown as an amplitude adjustment voltage VA at the control input 118.

Figure 12:
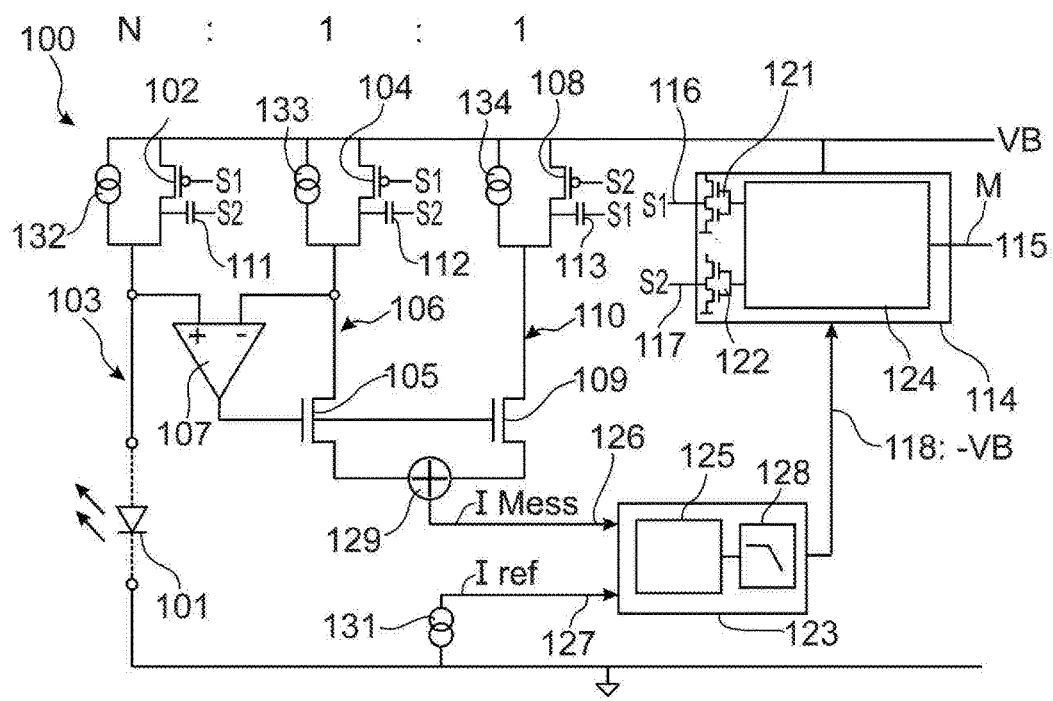
FIG. 12 a rough schematic representation of a complete circuit arrangement according to the disclosure operating according to the method of the disclosure, following the exemplary embodiment of FIG. 11, in an embodiment with PMOS field-effect transistors.
Figure 13:
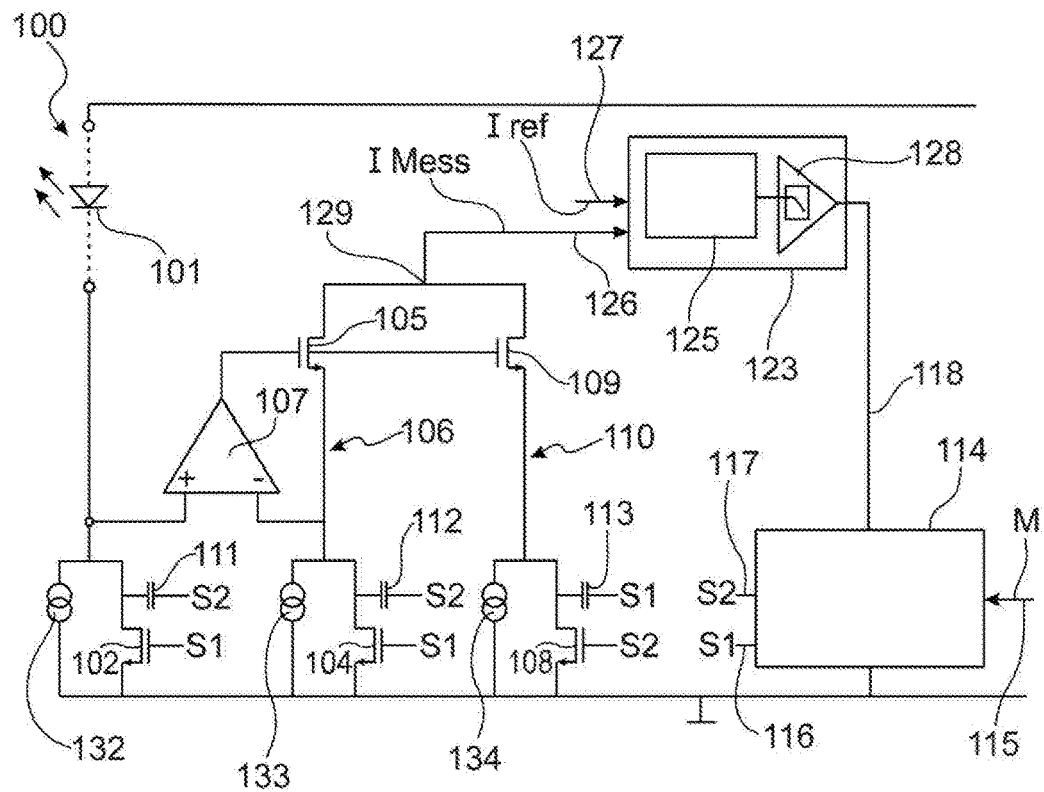
FIG. 13 a roughly schematic representation of a complete circuit arrangement according to the disclosure operating according to the method of the disclosure, following the exemplary embodiment of FIG. 11, in a modification of the embodiment of FIG. 12 with NMOS field-effect transistors.

In FIG. 12 and in FIG. 13, two complete embodiments of circuit arrangements according to the disclosure are shown in roughly schematic representation, of the exemplary embodiment of FIG. 11, and in one embodiment with PMOS field-effect transistors and on the other in an embodiment with NMOS field-effect transistors.

In this case, the same reference numerals are used according to the preceding figures for the circuit elements of both embodiments. The polarity of the PMOS field-effect transistors or the NMOS field-effect transistors, and the voltage potentials in the circuit arrangements are also correspondingly selected.

In FIG. 12, the simplified case of a coupling of the charge path 103 and the measurement paths 106, 110 in the ratio N:1:1 has also been assumed. The superposition stage 129 is thereby simplified with the same weighting of the measurement currents I1, I2 to a simple current addition device or, as shown in FIG. 13, to a simple current node.

In FIG. 12, a reference current source 131 for supplying the reference current Iref to the second input 127 of the comparison stage 125 is also entered.

Furthermore, in the embodiments according to FIG. 12 and FIG. 13 for the load circuit element 102, for the first measurement path circuit element 104 and for the second measurement path circuit element 108, a constant current source 132, 133 or 134 coupled with the relevant one of the circuit elements 102, 104 or 108 is arranged in parallel connection in a predeterminable coupling ratio.

In particular, the constant current sources 132, 133, 134 are dimensioned to each other in a same or similar coupling ratio as the load circuit element 102, the first measurement path circuit element 104 and the second measurement path circuit element 108 with each other. In this case, the constant current sources 132, 133, 134 provide a minimum current in the charge path 103 or the measurement paths 106, 110.

In summary, therefore, the load circuit element 102, here a MOSFET, which is in series with the laser diode 101 and provides its modulation current, possibly in a split manner, is emulated or coupled by one or more measurement path circuit elements 104, 108, which generate one or more standing measurement currents I1, I2 in fixed ratio to the modulation current, which measurement currents serve to determine an average modulation current.

For this purpose, with the aid of the auxiliary controller 107 and voltage control elements 105, 109, for example, cascode transistors, the voltage across the load circuit element 102 is transmitted to the voltage across the measurement path circuit elements 104, 108 for the purpose of coupling. They thus provide standing measurement currents I1, I2 in a defined ratio N:a:b, if they are applied as, possibly in a split manner, coupled components to the load current, that is, laser current $I_L$.

For the purpose of definition, it should be repeated that the modulation current is the alternating current component in the load current $I_L$, whereas the term modulation signal M denotes the signal, in particular data signal, from which the control signals S1, S2 for the load circuit element 102 and the measurement path circuit elements 104, 108 are discharged.

Two measurement paths 106, 110 coupled in this way can be controlled in a complementary manner, so that the resulting summation signal IMess varies comparatively slowly and hardly depends on the modulation signal M. If necessary, however, only one measurement path coupled with the laser current path 103 can be used.

According to the disclosure, the laser current IL or laser current fraction I1, I2 or IMess thus determined is compared with a reference current Iref, and the driving of the circuit elements 102, 104, 108 is readjusted so that the desired value is set.

In order to generate a corresponding variable driving of the circuit elements 102, 104, 108, a circuit block 114 operated with variable control or operating voltage VA or VB is used, from which a control signal S1 adjustable in its amplitude or two complementary control signals S1, S2 adjustable in their amplitudes can be generated.

While this disclosure has been described as having a preferred design, it is understood that it is capable of further modifications, and uses and/or adaptations of the disclosure and following in general the principle of the disclosure and including such departures from the present disclosure as come within the known or customary practice in the art to which the disclosure pertains, and as may be applied to the central features hereinbefore set forth, and fall within the scope of the disclosure.

LIST OF REFERENCE NUMERALS 100 circuit arrangement
101 charge element, in particular laser diode 102 load circuit element, in particular field-effect transistor, for example MOSFET
103 charge path, in particular laser current path
104 first measurement path circuit element, in particular field effect transistor (MOSFET)
105 first voltage control element, in particular field effect transistor (MOSFET)
106 first measurement path
107 auxiliary controller, in particular operational amplifier
108 second measurement path circuit element, in particular field effect transistor (MOSFET)
109 second voltage control element, in particular field effect transistor (MOSFET)
110 second measurement path
111 first capacitive component
112 second capacitive component
113 third capacitive component
114 circuit block
115 input connection of circuit block 114
116 first output connection of circuit block 114 for first control signal S1
117 second output connection of circuit block 114 for second control signal S2
118 control input of circuit block 114 for amplitude adjustment voltage and/or control voltage VA and/or for operating voltage VB
119 first multiplication stage of circuit block 114
120 second multiplication stage of circuit block 114
121 first push-pull final stage of circuit block 114
122 second push-pull final stage of circuit block 114
123 control device
124 single-ended-to-differential circuit of circuit block 114
125 comparison stage of control device 123
126 first input of comparison stage 125
127 second input of comparison stage 125
128 control amplifier of control device 123
129 superposition stage
130 circuit symbol in which first push-pull final stage 121, second push-pull final stage 122 and single-ended-to-differential circuit 124 are summarized
131 reference current source
132 constant current source
133 constant current source
134 constant current source
200 laser diode
201 field effect transistor, in particular MOSFET
202 operating voltage connection
203 reference potential, in particular mass or zero potential or signal ground
204 driving circuit for field effect transistor 201
205 DC-DC converter
206 input of DC-DC converter 205
207 output of DC-DC converter 205
a factor of, in particular split-manner, coupling of load circuit element 102 and first measurement path circuit element 104
b factor of, in particular split-manner, coupling of load circuit element 102 and second measurement path circuit element 108
D drain connection
G gate connection
ga weighting factor for first measurement current I1 in resulting measurement current IMess
gb weighting factor for second measurement current I2 in resulting measurement current IMess
I1 first measurement current
I2 second measurement current
IL load current, in particular laser current
IMess resulting measurement current
Iref reference current
M modulation signal
N factor of, in particular split-manner, coupling of load circuit element 102 and measurement path circuit element(s) 104, 108
S source connection
S1 first control signal
S2 second control signal, in particular complementary to the first control signal S1
VA amplitude adjustment voltage and/or control voltage
VB operating voltage
VB1 first operating voltage
VB2 second operating voltage
VF forward voltage at laser diode 200
VGS gate-source voltage at field effect transistor 201
Vsum total required voltage drop
Vt threshold voltage
ΔV modulation AC voltage and/or voltage for modulation of field effect transistor 201

The invention claimed is:

1. A circuit arrangement for controlling and measuring an electrical load current in at least one charge element, having
a load circuit element arranged in series with the charge element, which load circuit element is set up to control the load current;
at least one first measurement path having a first measurement path circuit element coupled with the load circuit element in a predefinable coupling ratio N:a; N:1 and controlled by a first control signal in common with the load circuit element and a first voltage control element arranged in series with the first measurement path circuit element;
an auxiliary controller for controlling the first voltage control element depending on a difference in voltages across the load circuit element and across the first measurement path circuit element such that the voltage across the measurement path circuit element is controlled depending on the voltage across the load circuit element, so that a first measurement current proportional to the load current is generated in the first measurement path circuit element and in the first voltage control element; and
a second measurement path having a second measurement path circuit element coupled with the load circuit element in a predefinable coupling ratio N:b; N:1 and a voltage control element arranged in series with the second measurement path circuit element, wherein
the second measurement path circuit element is set up for controlling by a second control signal complementary to a first control signal and the second voltage control element is set up for control in common with the first voltage control element by the auxiliary controller such that a second measurement current is generated in the second measurement path circuit element and in the second voltage control element, the variation of which is inversely proportional to that of the load current.

2. The circuit arrangement according to claim 1, wherein the load circuit element, the first measurement path circuit element or the second measurement path circuit element are connected to output connections on the one hand each to a capacitive component, that is, set up on the other hand for supplying a signal complementary to the relevant circuit element supplied control signal.

3. The circuit arrangement according to claim 1, further comprising a circuit block for forming the first control signal and optionally additionally the second control signal for controlling the load circuit element, the first measurement path circuit element or the second measurement path circuit element, wherein the circuit block for supplying an amplitude adjustment voltage and for forming the first control signal and optionally additionally the second control signal is set up with an amplitude depending on the amplitude adjustment voltage or an operating voltage that can be supplied to the circuit block.

4. The circuit arrangement according to claim 3, wherein
the circuit block is configured with CMOS devices,
the amplitude adjustment voltage is at least almost equal to an operating voltage provided for operating the CMOS devices, and
the circuit block is set up to receive the amplitude adjustment voltage supplied as the operating voltage and to form the first control signal and optionally additionally the second control signal with an output amplitude proportional to the operating voltage.

5. The circuit arrangement according to claim 3, wherein the circuit block is configured with a device for supplying an asymmetric modulation signal and for forming therefrom the first control signal and optionally additionally the second control signal as at least almost symmetrical or push-pull signals.

6. The circuit arrangement according to claim 3, further comprising a control device which is set up for
supplying the first measurement current and optionally the second measurement current,
evaluating the first measurement current and optionally the second measurement current, and
on this basis, forming and adjusting the amplitude adjustment voltage or operating voltage which can be supplied to the circuit block such that a target value of the first measurement current or optionally of a linear combination of the first measurement current and second measurement current and thus a target value of the modulation current, that is, the load current modulated by the first control signal, is achieved.

7. The circuit arrangement according to claim 6, wherein the control device for forming a summation signal is set up from the sum of the first and second measurement currents, wherein the summation signal has a lower or slower temporal variation with respect to the first and the second measurement current.

8. The circuit arrangement according to claim 1, wherein for the load circuit element or for the first measurement path circuit element or for the second measurement path circuit element, a respective constant current source is arranged in parallel connection coupled with the relevant one of the circuit elements in a predefinable coupling ratio.

9. The circuit arrangement according to claim 8, wherein the constant current sources are dimensioned to one another in a same or similar coupling ratio N:a:b; N:1:1 as the load circuit element, the first measurement path circuit element or the second measurement path circuit element are to one another.

10. The circuit arrangement according to claim 1, wherein the charge element is configured as at least one laser diode.

11. A method for controlling and measuring an electrical load current in at least one charge element, wherein
the load current is controlled by means of a load circuit element arranged in series with the charge element,
a first measurement path circuit element is coupled with the load circuit element in a predefinable coupling ratio N:a; N:1 and is controlled by a first control signal in common with the load circuit element,
a first voltage control element arranged in series with the first measurement path circuit element in at least one first measurement path by means of an auxiliary controller depending on a difference of the voltages across the load circuit element and across the first measurement path circuit element is controlled such that the voltage across the measurement path circuit element is controlled depending on the voltage across the load circuit element, so that a first measurement current proportional to the load current is generated in the first measurement path circuit element and in the first voltage control element, and
a second measurement path circuit element coupled with the load circuit element in a predefinable coupling ratio N:b; N:1 is controlled by a second control signal complementary to the first control signal and in that a second voltage control element arranged in series with the second measurement path circuit element in a second measurement path is controlled in common by means of the auxiliary controller with the first voltage control element such that a second measurement current is generated in the second measurement path circuit element and in the second voltage control element, the variation of which is inversely proportional to that of the load current.

12. The method according to claim 11, wherein the first control signal and optionally additionally the second control signal for controlling the load circuit element, the first measurement path circuit element or the second measurement path circuit element is formed by a circuit block, wherein an amplitude adjusting voltage supplied by the circuit block and the first control signal and optionally additionally the second control signal is formed with an amplitude depending on the amplitude adjustment voltage or an operating voltage that can be supplied to the circuit block.

13. The method according to claim 12, wherein the circuit block is set up to receive the amplitude adjustment voltage supplied as the operating voltage and to form the first control signal and optionally additionally the second control signal with an output amplitude proportional to the operating voltage.

14. A method for controlling and measuring an electrical load current in at least one charge element, wherein
the load current is controlled by means of a load circuit element arranged in series with the charge element,
a first measurement path circuit element is coupled with the load circuit element in a predefinable coupling ratio N:a; N:1 and is controlled by a first control signal in common with the load circuit element,
a first voltage control element arranged in series with the first measurement path circuit element in at least one first measurement path by means of an auxiliary controller depending on a difference of the voltages across the load circuit element and across the first measurement path circuit element is controlled such that the voltage across the measurement path circuit element is controlled depending on the voltage across the load circuit element, so that a first measurement current proportional to the load current is generated in the first measurement path circuit element and in the first voltage control element, and
the charge element is configured as at least one laser diode.

15. A use of at least one circuit arrangement according to claim 1 for driving at least one charge element in optical data transmission.

16. The use according to claim 15, wherein the charge element is configured as at least one laser diode.

17. The use according to claim 15, wherein the optical data transmission is embodied by at least one active optical cable (AOC).

* * * * *